United States Patent
Filosa (10) Patent No.: US 12,248,036 B2
(45) Date of Patent: Mar. 11, 2025

(54) PORTABLE METER FOR MEASURING A FORCE GENERATED BY A MAGNETIC APPARATUS

(71) Applicant: S.P.D. S.P.A., Caravaggio (IT)

(72) Inventor: Giuseppe Filosa, Caravaggio (IT)

(73) Assignee: S.P.D. S.P.A., Caravaggio (IT)

( * ) Notice: Subject to any disclaimer, the term of this patent is extended or adjusted under 35 U.S.C. 154(b) by 123 days.

(21) Appl. No.: 17/919,867

(22) PCT Filed: Apr. 19, 2021

(86) PCT No.: PCT/IB2021/053212
§ 371 (c)(1),
(2) Date: Oct. 19, 2022

(87) PCT Pub. No.: WO2021/214632
PCT Pub. Date: Oct. 28, 2021

(65) Prior Publication Data
US 2023/0228826 A1    Jul. 20, 2023

(30) Foreign Application Priority Data

Apr. 21, 2020  (IT) .......................... 102020000008458

(51) Int. Cl.
*G01R 33/038*   (2006.01)
*B23Q 3/154*    (2006.01)

(52) U.S. Cl.
CPC ....... *G01R 33/0385* (2013.01); *B23Q 3/1543* (2013.01); *B23Q 3/1546* (2013.01)

(58) Field of Classification Search
CPC . G01R 33/0385; B23Q 3/1543; B23Q 3/1546
See application file for complete search history.

(56) References Cited

U.S. PATENT DOCUMENTS 6,636,153 B1 * 10/2003 Barton ................... H01F 7/206
                                                              361/143
7,782,164 B2 *  8/2010 Tiberghien ............... H01F 7/04
                                                              335/289

(Continued)

FOREIGN PATENT DOCUMENTS

| WO | 2008142716 A2 | 11/2008 |
| WO | 2017056014 A1 | 4/2017 |

*Primary Examiner* — Walter L Lindsay, Jr.
*Assistant Examiner* — Milton Gonzalez
(74) *Attorney, Agent, or Firm* — Dickinson Wright PLLC; Andrew D. Dorisio (57) ABSTRACT

A portable meter (1) for measuring a force generated by a magnetic apparatus (2), comprising a mobile probe (3) configured to be coupled to the magnetic apparatus (2) whose force needs to be measured, the probe (3) comprising at least one active ferromagnetic element (4) which has a configuration corresponding to that of a pole (N, S) on the magnetic apparatus whose force needs to be measured, the probe being equipped with alignment means (5, 6) configured to align the at least one active ferromagnetic element (4) with at least one magnetic pole (N, S) on the magnetic apparatus (2), the at least one active ferromagnetic element (4) having at least one turn (B)—made of an electrically conductive material—wound around it, and a detection unit (7) interfaced with the at least one turn (B) in order to detect a magnetic flux flowing through the coil at least during a transient of activation/deactivation of the magnetic apparatus.

12 Claims, 4 Drawing Sheets

(56) References Cited

U.S. PATENT DOCUMENTS

| | | | |
|---|---|---|---|
| 8,390,271 B2 * | 3/2013 | Cardone | ................ B23Q 3/154 |
| | | | 324/205 |
| 8,890,641 B2 * | 11/2014 | Tiberghien | .............. B29C 45/64 |
| | | | 335/289 |
| 2011/0037547 A1 * | 2/2011 | Cardone | ............... B25B 11/002 |
| | | | 335/289 |
| 2012/0234109 A1 | 9/2012 | Sears | |

* cited by examiner

PORTABLE METER FOR MEASURING A FORCE GENERATED BY A MAGNETIC APPARATUS

FIELD OF THE INVENTION

The present invention relates to a portable meter for measuring a force generated by a magnetic table.

BACKGROUND ART

Magnetic clamping systems (or magnetic apparatuses) are devices designed to anchor ferromagnetic material during mechanical processing with machine tools, as part of the movement (handling and/or lifting) of mechanical workpieces or for rapid mould clamping.

Some magnetic apparatuses, defined as 'electro-permanent', comprise a magnetic section (known as an 'electropermanent magnetic module') and an electronic activation/deactivation system (known as a 'control unit').

The electropermanent magnetic module includes a load-bearing structure made of mild steel, which is designed to contain all the internal components and one or more pole pieces made of mild steel, with various shapes and features so that it can be adapted for different needs. Pole pieces, which are also known as magnetic poles, are usually arranged so as to define an anchorage surface.

Each magnetic pole has permanent magnets coupled therewith, as well as what are known as "reversing" magnets. Each reversing magnet is coupled to a solenoid, which can change the polarity thereof.

When the magnetic flux generated by the permanent magnets is added to that of the reversing magnet, the magnetisable surface is activated. When the field generated by the permanent and the reversing magnets is removed, the magnetisable surface is deactivated.

The activation solenoids are controlled by a control unit which comprises: a controlled two-way rectifier, which supplies appropriate power to the solenoids in the electropermanent magnetic module; one or more control panels, to allow the operator to activate and deactivate the electropermanent magnetic module; a system management control logic; and an electrical connection system, usually a cable, to link the control unit and the electropermanent magnetic module.

The purpose of the control unit is to activate/deactivate the electropermanent magnetic module, through the magnetisation, demagnetisation, or polarity reversal of part or all of the reversing magnets contained within the said module.

Except when needed to complete the two magnetisation operations, the control unit may be electrically disconnected from the magnetic module.

There are also further known magnetic apparatuses which function differently.

For example, there are known magnetic apparatuses which are formed of electromagnets. In this case, to magnetise the magnetisable surface it is necessary to provide a continuous power supply (since these apparatuses do not comprise permanent magnets) to the coils coupled with the plurality of magnetic poles that define the magnetisable surface.

Other magnetic apparatuses are also known, which are commonly referred to as 'permanent magnets'. These systems work by exploiting the magnetic field produced by permanent magnets and the activation of such systems does not require electrical devices and solenoids.

The magnetic action can be activated or deactivated using a lever that mechanically modifies the combination of iron and magnet located below the magnetisable surface. It is the best known and most widespread system for the simple handling of ferrous materials, above all because it does not require electricity and maintenance in general.

However, one feature shared by all magnetic apparatuses is the presence of ferromagnetic surfaces onto which the piece to be anchored is positioned and which perform the anchorage function (by establishing a magnetic flux).

The anchorage function, i.e. the force with which the specific piece is held by the magnetic system, is always conditioned by the physical characteristics of the said piece and can vary significantly depending thereupon.

In particular, the force is conditioned by the nature of the ferromagnetic material of which the piece to be clamped is constituted, by the possible presence of air gaps between the anchorage surface and the piece to be anchored, and by the geometric features of the piece to be clamped.

Generally the manufacturers of magnetic systems provide graphs that show the variation in the performance (force generated) depending on the variation in the said parameters, one at a time.

Obviously, these graphs do not simplify life for a generic operator required to determine the force with which a piece is held, for example, before starting work with a machine tool.

This is primarily because the "de-rating" parameters all vary at the same time (not one at a time, as shown in the graphs) and secondly because it is not always possible to perfectly determine their size.

For example, if we refer to the air gap, determining both the size and the average value is always very complicated, considering that the said gap can only be observed from the edge of the piece to be anchored, and even if one did have such information available, it would be practically impossible to easily determine the anchorage force from the said graphs.

At present, the force with which the generic piece is held by a magnetic system is measured using two methods and both have the drawback of always significantly disturbing the anchorage status.

The first method consists of the use of a mechanical force generator (e.g. a press) and a load cell.

The mechanical force generator will apply the said force to the piece anchored to the magnetic surface until it comes away, using the load cell to document the value of the force at which detachment occurred.

This technique is mainly used when testing magnetic equipment. During servicing/testing, the equipment is transported to where a press is available, and is tested.

In the case of large appliances, such as magnetic tables (for example for clamping workpieces during machining) or in the case of hoists for heavy objects, this is not possible.

Apart from any technical limitations and costs relating to attempting to reuse this kind of strategy in every possible situation, it is clear that obtaining the information relating to the clamping force necessarily results in significantly disturbing such force (leading to detachment).

The second method involves obtaining an appropriate air cavity, or air gap, between the magnetic tables and the workpiece to be anchored inside which a probe can then be inserted which is connected to a magnetic induction meter. Knowing the magnetic induction allows calculations to be made to estimate the anchorage force.

This technique is easier to implement as it is not necessary to move the apparatus tested but it essentially modifies the anchorage conditions.

In particular, the introduction of gaps leads to exponential decreases in force, therefore, the force is known but anchorage is much worse than actual conditions.

Some more advanced electropermanent systems, such as the one described in document EP3357075-A1, have an integrated device for measuring force. By measuring the magnetic flux, these systems can provide information about the actual anchorage force. But as mentioned, these systems are integrated into the magnetic table.

SUMMARY OF THE INVENTION

The object of the present invention is to overcome the technical drawbacks of the commonly known technique.

A further object of the invention is to provide a portable meter capable of detecting the force with which the magnetic system clamps a generic workpiece and which is also simple, reliable, and inexpensive.

A further object of the present invention is to provide a portable meter which minimises or eliminates disturbance of the anchorage conditions, allowing reliable field-testing.

This and other objects are achieved by means of a portable meter produced according to the technical teachings of the claims appended hereto.

BRIEF DESCRIPTION OF THE FIGURES

Further features and advantages of the innovation will become clearer in the description of a preferred but not exclusive embodiment of the device, illustrated—by way of a non-limiting example—in the drawings annexed hereto, in which.

DETAILED DESCRIPTION OF THE INVENTION

With reference to the aforesaid figures, reference number 1 is used to denote, as a whole, a meter for measuring the force of a magnetic apparatus 2, 2A.

The portable meter 1 for measuring a force generated by a magnetic apparatus 2, comprises a mobile probe 3 configured to be coupled to the magnetic apparatus 2 whose force will be measured, and a detection unit 7, which is either connected or connectable to the probe 3.

The connection between the detection unit 7 and the probe 3 can be done in a simple way, for example through a cable 20 (which is cropped in the figure, for simplicity) equipped with at least one connector 12.

Other more sophisticated forms of connection may be envisaged, such as a wireless connection for the transmission of signals featuring transceiver systems on both the probe and the detection unit 7.

The probe 3 comprises at least one active ferromagnetic element 4, which has a configuration essentially corresponding to that of a pole N, S on the magnetic apparatus whose force needs to be measured.

In the present text, the term 'active ferromagnetic element 4' means that the said element has at least one turn B (or coil) made of electrically conductive material wound around it, the turn being interfaced or 'readable' by the detection unit 7, in order to detect a magnetic flux flowing through the turn during a transient of activation/deactivation of the magnetic apparatus.

Figure 1:
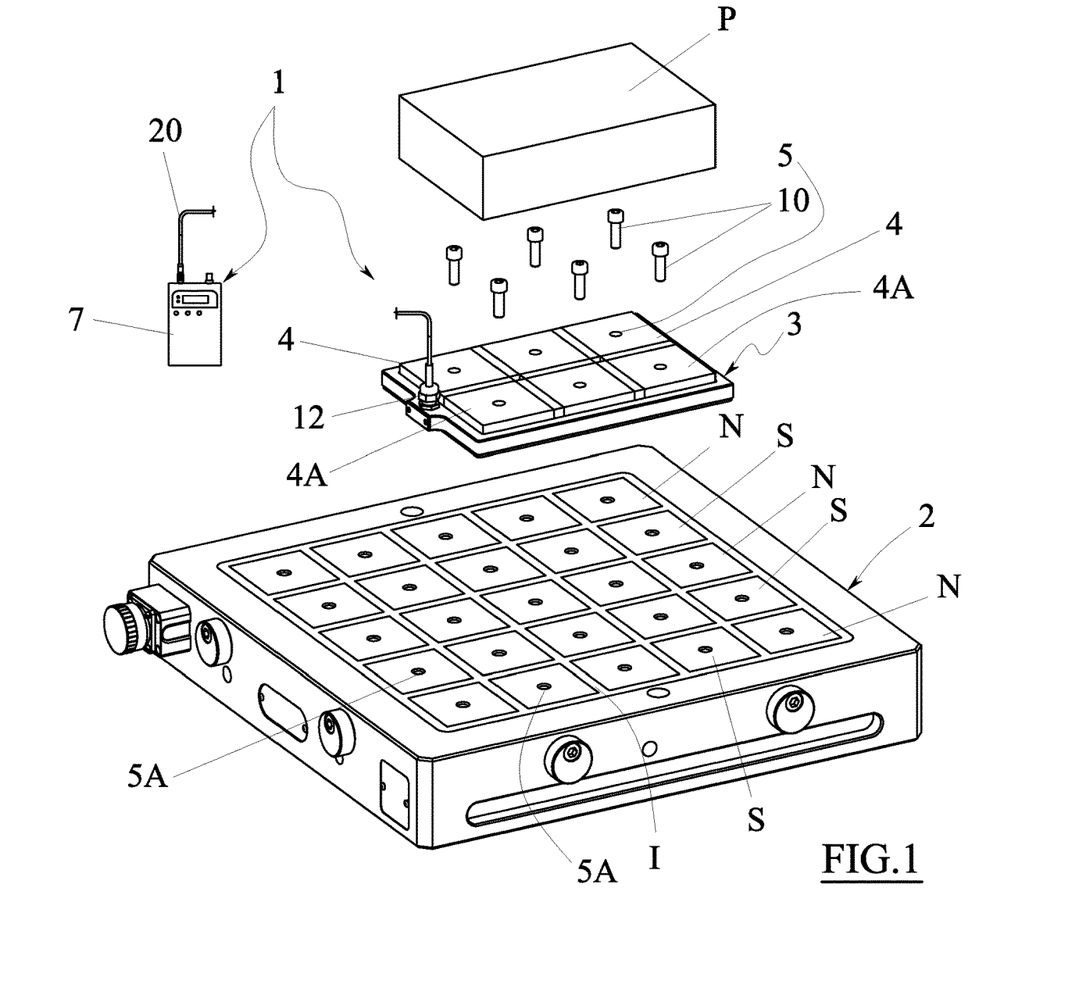
FIG. 1 is a simplified perspective view, in a partially exploded configuration, of a meter according to the present invention, together with a magnetic apparatus and a workpiece to be clamped.
Figure 3:
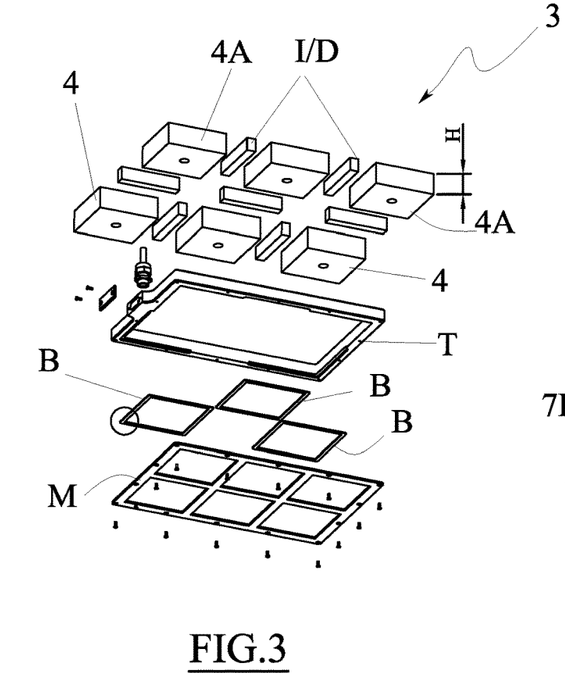
FIG. 3 shows an exploded perspective view of a probe, of the open-loop kind, of the meter in FIG. 1.
Figure 4:
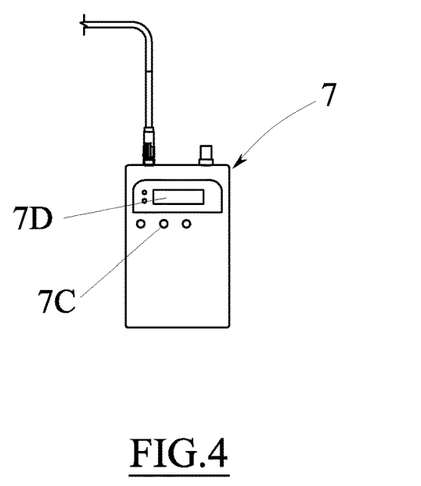
FIG. 4 shows a detection unit of the meter of the present invention, which cooperates with the probe during use.

In the example shown in FIG. 1, the probe 3 features six ferromagnetic elements 4, 4A. In FIG. 3, it can be seen that the turns B are only around three of the ferromagnetic elements (those denoted 4), which are therefore active.

On the probe 3, there are also three ferromagnetic elements 4A present, which, for simplicity, are devoid of turns B.

The passive ferromagnetic elements 4A and the active ones 4 are mutually separated by a magnetic insulator I. The magnetic insulator may be made, for example, of brass, aluminium, non-magnetic stainless steel, plastic, resin, copper, etc.

The constituent material of the ferromagnetic elements may be, for example, an iron with high permeability and low coercive field, such as pure iron (known by the trade name ARMCO).

Note that the probe 3 is equipped with alignment means 5, 6 configured to align the at least one active ferromagnetic element 4 with at least one magnetic pole N, S on the magnetic apparatus 2.

In this text, the term 'alignment means' may be any means capable of allowing an alignment or coupling of the at least one ferromagnetic element 4 with at least one pole N, S of the magnetic apparatus 2, so as to allow a effective and precise positioning of the active ferromagnetic element 4 on top of a pole N, S.

The said alignment means may be of the visual kind. For example, the ferromagnetic element 4 could be simply aligned with the pole by visually centring it on top thereof, for example using the insulating material I (for example epoxy resin) as a reference, since the said insulating material is often a different colour or has different physical characteristics from those of the pole on both the magnetic apparatus and the probe.

It should be emphasised that the at least one active ferromagnetic element 4 features a configuration corresponding to that of at least one active surface of the pole.

'Active surface of the pole N, S' means the usually flat surface designed to be coupled with a workpiece P to be clamped during machining; the active surface of each pole N, S is advantageously surrounded by an insulator I, which makes it easily and univocally identifiable.

As can be seen in FIG. 1, it should be noted that the magnetic apparatus 2 may be a magnetic table featuring a plurality of poles N, S on the support surface 2A thereof, the said holes being arranged in a chessboard pattern and mutually insulated by insulating material I.

In the example shown, the poles N, S have a square configuration and therefore the active ferromagnetic elements 4 of the probe 3 are also square and identical in size to those on the apparatus 2. Obviously, the passive ferromagnetic elements 4A also correspond (are identical) in shape and arrangement to those on the magnetic apparatus 2 to be tested.

It must be said that the square shape of poles, and consequently of the magnetic elements, is just one of the possibilities. There may be rectangular poles (as will be seen later), circular poles, etc., and consequently the magnetic elements 4, 4A will have the same shape as the poles whose force must be measured.

Therefore, the shape and arrangement (distance from one another and positioning) of the ferromagnetic elements 4, 4A and the probe 3 are identical to the shape and arrangement of the poles N, S on the magnetic apparatus 2 to be tested, even if the probe 3 may feature fewer ferromagnetic elements 4, 4A than the poles N, S on the apparatus to be tested.

This way, it is quite simple to visually align the probe with the magnetic apparatus.

In FIG. 1 it can be seen that other types of alignment means may be envisaged. For example, each ferromagnetic element (or only some of those on the probe) may feature a hole 5 for a pin or screw 10 which engages in corresponding holes 5A (which may be threaded) in the magnetic apparatus 2 (normally featured in the magnetic plates).

These alignment means are extremely effective as they make positioning errors almost impossible.

If screws 10 are used, the fastening of the probe 3 to the magnetic apparatus is even more stable.

To obtain an effective alignment (or centring) with the magnetic apparatus, at least two pins or screws 10 (and consequent holes 5) are advantageously envisaged.

Figure 6:
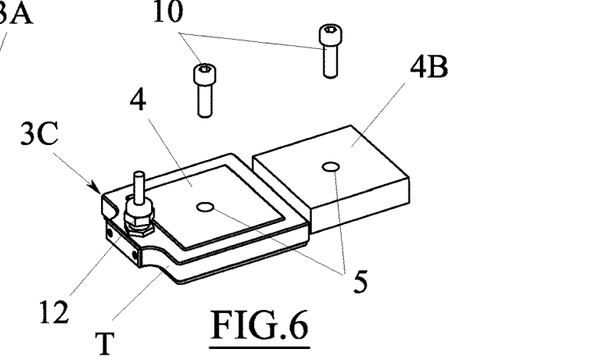
Figure 6A:
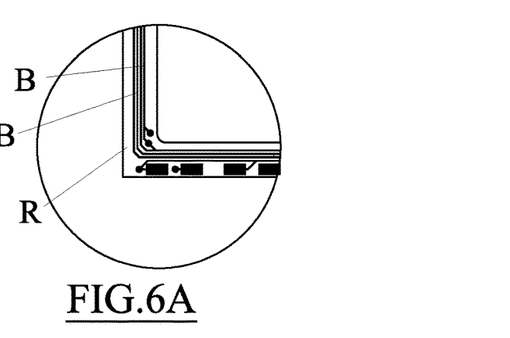
FIG. 6A shows, in detail, the detail circled in FIGS. 3 and 10.

To complete the description, it should be noted that the turn B (or rather, each turn B) may be configured as shown in FIG. 6A.

In this text, the term 'turn' is used to mean the basic unit of a winding. Advantageously, instead of a single turn B, an element made up of several turns B (i.e. a coil) may be used, which considerably improves the reading of the magnetic flux.

FIG. 6A shows the details of this coil (set of turns B), which may be made with a copper track R on a vetronite structure, suitably insulated with solder mask.

Obviously, the coil of turns B can also be made in other more conventional ways (e.g. wound directly around the ferromagnetic element).

It must be said that the differentiation between the 'active' and 'passive' ferromagnetic elements on the plate does not depend on whether or not there is a turn coupled with these elements. But it is more of a logical differentiation.

Indeed, it is possible—for construction simplicity—that all the ferromagnetic elements 4, 4A on the probe 3 to be surrounded by at least one turn B. During the 'reading', however, only one or half or only some of the ferromagnetic elements present on the probe 3 will be 'read' by the detection unit 7. In this case, the ferromagnetic elements which have been 'read' can be defined as 'active' 4.

It is obviously also possible that the detection unit 7 is configured to read the turns B on all the ferromagnetic elements 4, 4A. In this case, it will detect a first flux from half of the ferromagnetic elements and a flux with the opposite polarity from the others.

While not essential, the detection of fluxes in the 'opposite' direction can be used by the detection unit 7 for testing.

Structurally, the probe 3 is very simple, and is shown clearly in FIG. 3. It may comprise a frame T below which a jig M is fastened (for example, by means of screws). The ferromagnetic elements 4, 4A, together with the respective turns B, are coupled with the jig M.

An arrangement of spacers D, made of a magnetically insulating material (e.g. brass), is then created and the space between the magnetic elements is filled with insulating material I, such as, for example, a resin.

The spacers D may also be welded (for example braze-welded) to the ferromagnetic elements 4, 4A.

Figure 2:
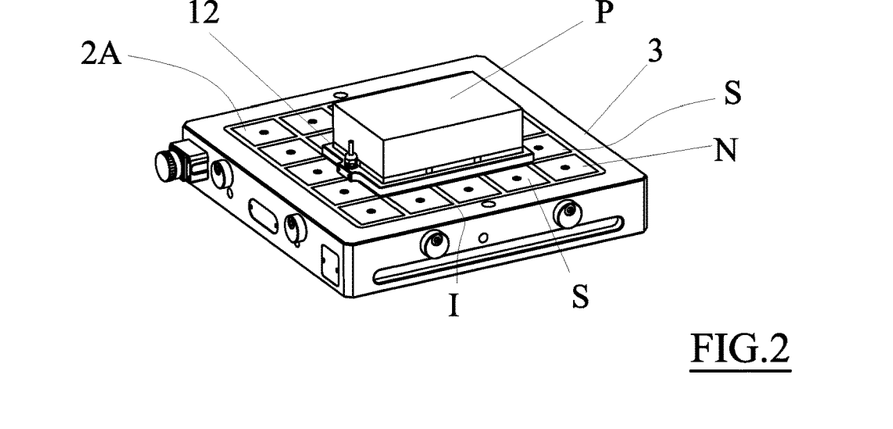
FIG. 2 is a perspective view of the meter in FIG. 1 during a test phase.

FIG. 3 clearly shows that the turns B are located on alternate ferromagnetic elements. They are also preferably connected in series. This way, the active ferromagnetic elements are those that read a flux produced by the magnetic equipment with the same polarity. For example, when the coil is placed on top of the table, as in FIG. 2, the active ferromagnetic elements are located on the N poles. Obviously, it is also possible to arrange the active elements on the S poles (by moving the probe 3 one line lower, then placing it closer to the lower edge of the table in FIG. 2).

The description above relates to a particular configuration of a six-pole stackable probe 3 on a magnetic apparatus 2 like that shown, and suitable for detecting a force acting on a workpiece P like that shown.

However, precisely because of the construction simplicity and the extremely low cost of the probes 3, other types of probes 3 may be envisaged, each suitable to detect the force on different magnetic apparatuses or simply on different shaped workpieces P.

Therefore, in general, the probe may comprise a plurality of active ferromagnetic elements 4 and a plurality of passive ferromagnetic elements 4A, arranged in a chessboard pattern, with a magnetic insulator I positioned between each active ferromagnetic element 4 and each passive ferromagnetic element 4A positioned side by side, the plurality of active and passive ferromagnetic elements having the same shape and arrangement as that of the poles N, S on the magnetic apparatus 2 whose force needs to be measured.

Figure 5:
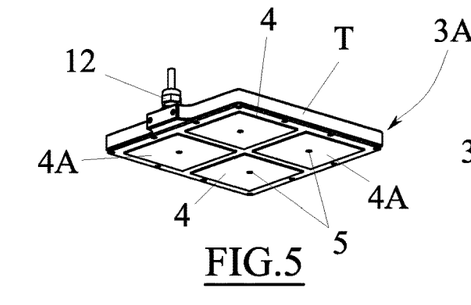
FIGS. 5, 6, and 7 show an assembled perspective view of the possible configurations of the probe in FIG. 3.
Figure 7:
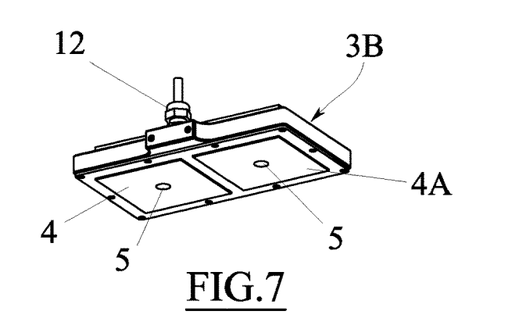

Some examples of possible alternative or additional configurations of the probe 3 are shown in FIGS. 5 to 7.

In these, the same reference numbers used earlier are used to denote parts that are functionally similar to those already described. They will not, therefore, be described again.

Generally, in any case, the various kinds of probe will all be denoted 3 and, to simplify the description, each kind of probe will be identified with a letter after the 3.

The probe 3A in FIG. 5 has four ferromagnetic elements 4, 4A instead of six. During operation, two ferromagnetic elements are active and two are passive. The other structural characteristics are identical to those already described.

The probe 3B in FIG. 7 only has two ferromagnetic elements. During use, one is active and one is passive.

This probe is obviously used for small workpieces P.

Obviously, other types of probes may be envisaged, such as with eight ferromagnetic elements, 10 ferromagnetic elements, etc. Preferably, but not essentially, the ferromagnetic elements are featured on the probe in even numbers.

The probes described so far are of the open-loop kind. Indeed, with the presence of the workpiece P (which may be a generic workpiece to be clamped) on the probe 3, the magnetic circuit closes outside the said probe, running through the workpiece.

However, certain other kinds of (also open-loop) probes may be envisaged, like the one shown in FIG. 6, which is denoted 3C.

This probe 3C only features one active ferromagnetic element 4.

During use, it must be coupled to another passive ferromagnetic element 4B and be separate from (not integrated into) the said probe. The passive element 4B serves solely to close the magnetic circuit, and can have any dimensions in a plan view.

However, the thickness must be similar or equal to that of the magnetic element 4 on the probe.

Figure 8:
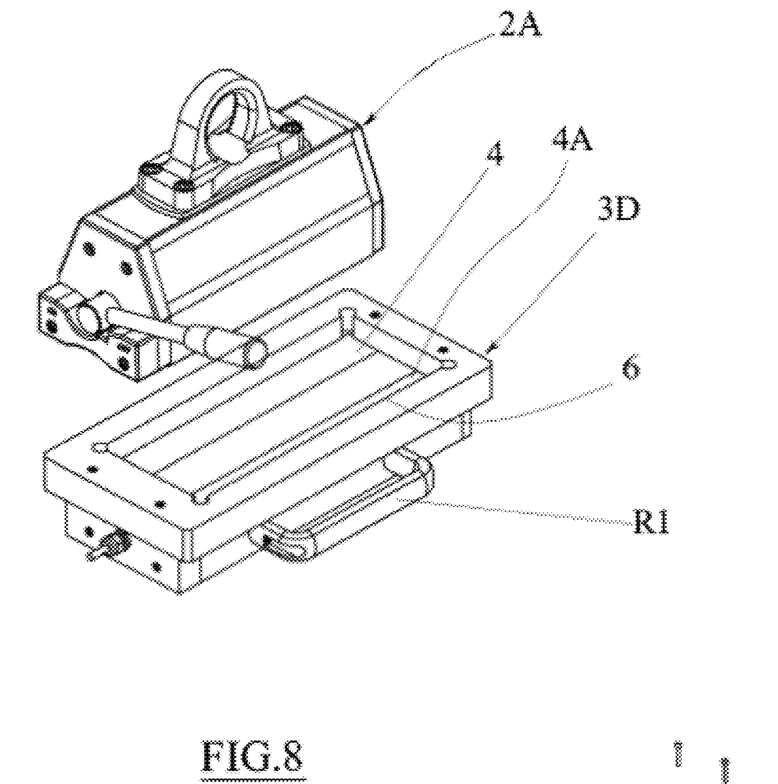
FIG. 8 shows, in a perspective view, a different configuration of the probe in FIG. 3 (specifically, of the closed-loop kind) and a different magnetic apparatus with which the probe can be used.

FIG. 8 shows a further different embodiment of the probe, which—in this case—is a closed-loop version. This 3D probe is optimised for measuring the force of the very popular portable manual systems known as 'permanent magnet' systems 2A.

As the 3D probe is of the closed-loop variety, it has a single element 140 made of ferromagnetic material with the ferromagnetic elements 4 and 4A made using the shapes formed on the magnetic element. Indeed, the ferromagnetic elements 4, 4A have an identical configuration to the poles on the manual apparatus 2A and are magnetically short-circuited.

Figure 9:
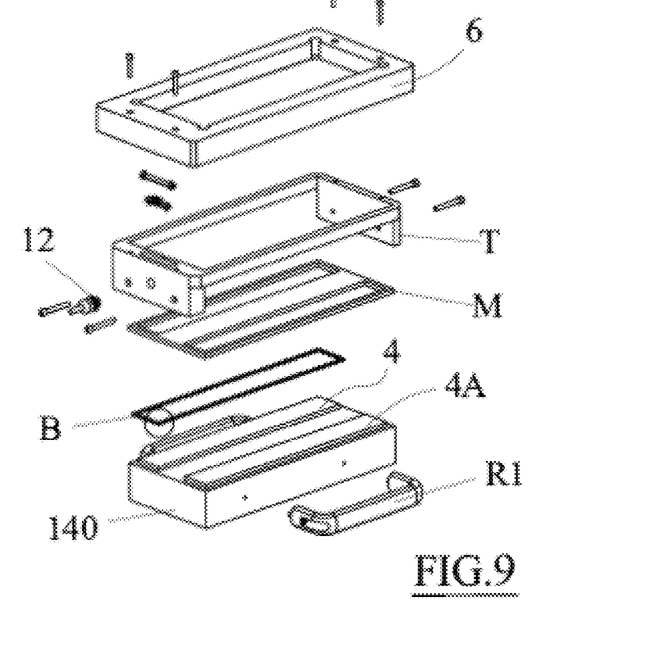
FIG. 9 is an exploded perspective view of the probe in FIG. 8.

In this case, the poles on the apparatus are rectangular and extremely elongated, and consequently so too are the ferromagnetic elements 4, 4A on the 3D probe (see FIG. 9).

In the embodiment described above, the ferromagnetic elements 4 and 4A are made as a single piece with the element 140, but different configurations are possible, for example, configurations in which the ferromagnetic elements are simply mechanically secured to an element that magnetically short-circuits them.

The alignment system of this 3D probe envisages a simple frame 6 which centres the perimeter of the magnetic apparatus 2A in relation to the ferromagnetic elements 4, 4A on the probe, ensuring they match perfectly with the poles on the apparatus 2A.

Obviously, the turn B—which has to surround at least the active pole 4—also has an elongated configuration, as can also be seen in FIG. 9.

Advantageously, this 3D probe also features a handle R1 for easy carrying.

Figure 11:
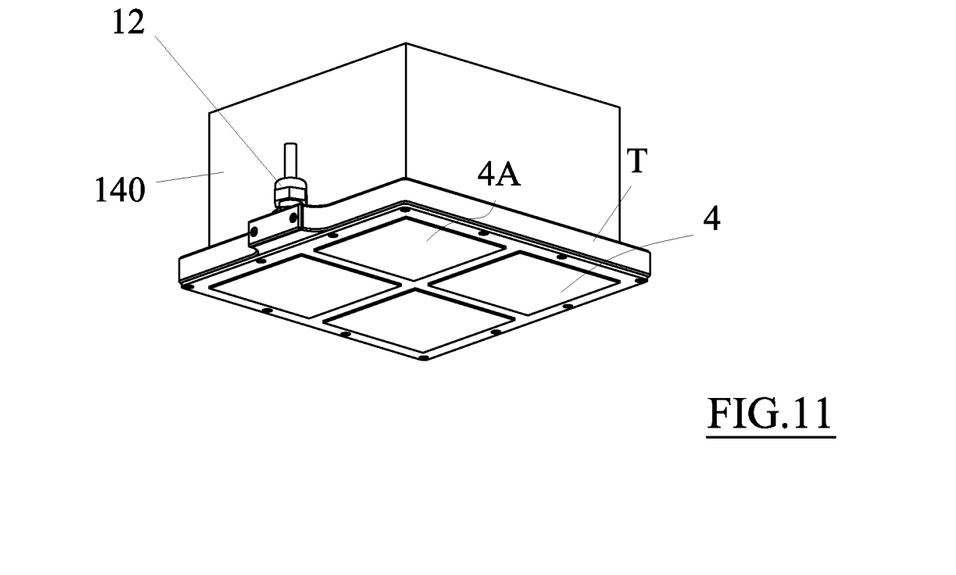
FIGS. 11 and 12 show, in a—respectively, assembled and exploded—perspective view, a different configuration of the probe (of the closed-loop kind).
Figure 12:
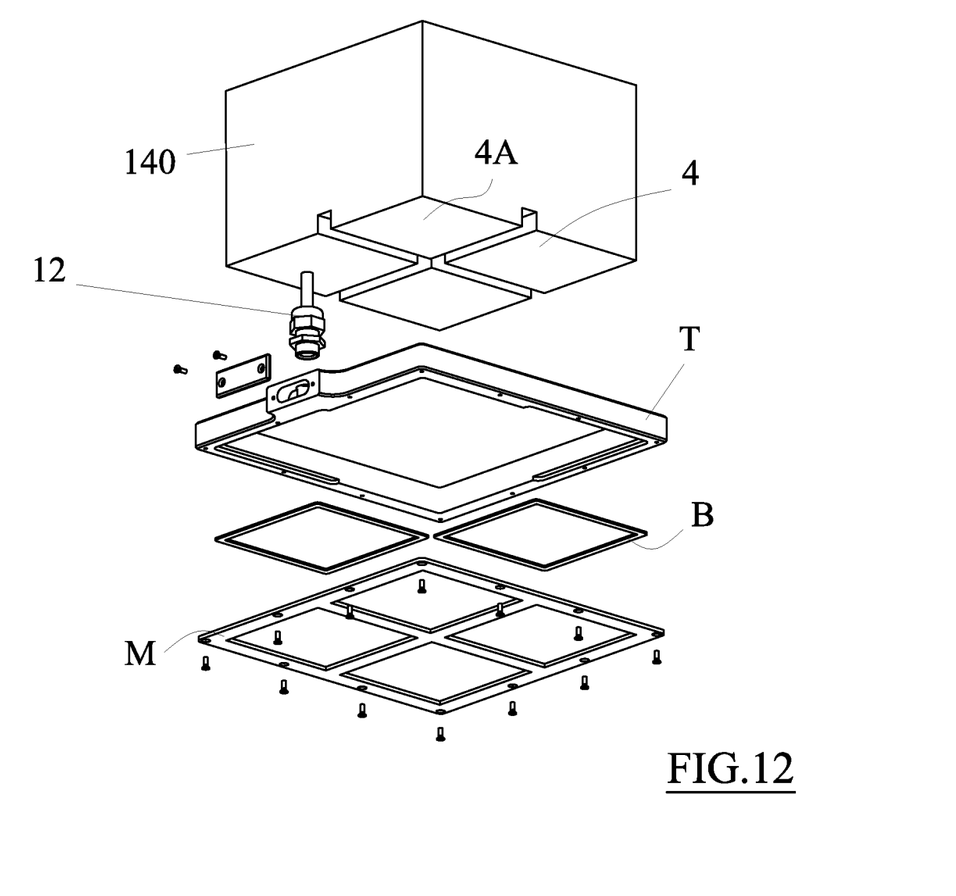

FIGS. 11 and 12 show a further possible configuration of a closed-loop probe.

Also in this case, the ferromagnetic elements 4 and 4A are made as a single piece with the element 140, and therefore magnetically short-circuited.

Obviously, also in this case, the element 140 may be formed as a single piece (as shown in the figure) or as several assembled pieces.

In some variants thereof, the system described pursues the objective of not disturbing the magnetic flux produced by the magnetic apparatus 2, 2A, or doing so only minimally by means of thin elements of ferromagnetic material.

Indeed, a thickness H of the ferromagnetic elements 4, 4A may be comprised between 1 and 10 mm, preferably between 2 and 5 mm, even more preferably it is 2 mm.

Specifically, the thickness H of the ferromagnetic element or elements may be calculated to ensure maximum permeability in the intended use conditions. This is possible because the permeability curve of the material used is known exactly.

In particular, assuming that the flux that flows through the anchorage surfaces is equal to Ø, and assuming this flux is uniform, the magnetic induction action thereof can be calculated using the following formula:

$$B = Ø/S \qquad \text{R1:}$$

where B is the magnetic induction and S is the surface crossed by the flux. Once B is known, the surface force density P can be calculated through simple relationships linked to the $B^2$ which are known in the literature, such as:

$$P = \frac{B^2}{2\mu 0} \qquad \text{R2}$$

Whatever magnetic system is considered, whether permanent or electro-permanent, the activation thereof produces a variation in the magnetic flux, ranging from zero to a specific value.

This flux variation can be intercepted and processed through the turns B (or coils) located on the perimeter of the ferromagnetic elements 4, 4A, interposed between the magnetic surface and the workpiece P to be anchored.

The probes 3 can be configured to be magnetically permeable, totally devoid of air gaps, and with completely identical profiles to the magnetic surfaces (or at least the poles) on top of which they are laid or to which they are integral.

During the activation phase of the magnets underlying the pole, the turn B integrated into these probes will generate a voltage at its ends proportional to the variation in the magnetic flux flowing through the said turn (and therefore through the pole). In the literature, this relationship is known as Faraday Neumann Lenz's law:

$$e(t) = -n\frac{\partial Ø}{\partial t} \qquad \text{R3}$$

where e(t) the voltage generated, n is the number of turns comprising the sensing coil and $$\frac{\partial Ø}{\partial t}$$

is the derivative with respect to the time of the magnetic flux that crosses the surface of the sensing coil.

By inverting this relationship, one can calculate the average magnetic flux Ø, and subsequently—using the relation R1—the induction B.

Then, as the induction B is known and using relationships known in the literature (e.g. R2) one can calculate the surface force density P which—once produced for the surface of the magnetic pole S— provides the value of the force generated by the individual magnetic pole N, S.

The detection unit 7 will process the signals from probe 3, and subsequently reverse the equation R3 in order to calculate the magnetic induction as in R1.

Once the induction B is known and likewise the surface of the active ferromagnetic elements 4 on the probe, the unit will be able to calculate the pressure as in R2, and the anchorage force of one or more surfaces.

It must be emphasised that, to ensure the probe does not significantly influence the force with which the anchorage system clamps the ferromagnetic material thereto, the magnetic permeability of the material used for the ferromagnetic elements and the thickness thereof are fundamentally important, because the reluctance, i.e. the measure of the probe's opposition to the passage of the magnetic flux, is inversely proportional to the magnetic permeability of the material $\mu=\mu_o \cdot \mu_r$ and directly proportional to the probe thickness.

Therefore, it is advantageous to have the ferromagnetic elements 4, 4A made of pure iron, ARMCO, etc.

Obviously, the lower the ratio between probe thickness and the total magnetic path length, the less significant the geometric characteristics of the ferromagnetic elements 4, 4A will be in the calculation of the total flux.

The detection unit 7 will be configured to accept multiple probes 3, 3A, 3B, 3C, 3D etc.

In addition to performing the calculations seen above, the unit 7 will also be able to perform them parametrically, accepting multiple input probes, recognising them and adapting the computational procedures to the physical, magnetic, and mechanical characteristics of the probe in question.

For example, each probe 3 can incorporate an identifier 300 (FIG. 10) readable by unit 7 to identify the type of probe coupled thereto, and then parameterise the calculations based on the physical characteristics of the said probe 3.

Use of unit 7 with the appropriate probe 3 means one can always measure the relative anchorage force performance, in any position and for any magnetic apparatus, without significantly altering the performance of the magnetic circuit in question.

Since, as it is known, permanent or electropermanent magnetic systems remain in the same state unless subjected to mechanical or electrical action, it clearly follows that the detection unit can only be activated during the magnetic apparatus magnetisation stage.

An appropriate control panel 7C will allow operation of the unit 7 and show the force measured.

Figure 10:
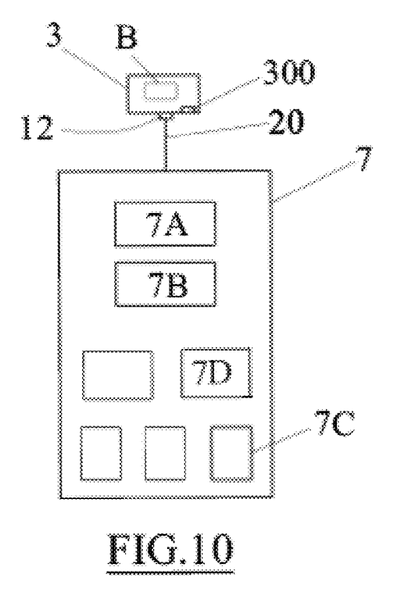
FIG. 10 shows, schematically, the detection unit in FIG. 4 when coupled to a probe (also shown schematically)

FIG. 10 shows a possible diagram illustrating the principle on which this device is based.

Note how the probe 3 can include, in addition to the sensing coil S, an indicator 300 that allows the unit to recognise the said coupled probe. The identifier 300 can simply be a resistor, a chip or any other system that allows the probe to be uniquely marked.

A low noise, low offset pre-amplification block 7A amplifies the signal coming from the coil S. This signal is then processed by the processing unit 7B in order to solve the equations stated above.

The implementation of the R3 equation deserves comment. Since inverting this equation requires the computation of an integral, particular care must be taken in managing the relative calculation routine. Let's consider a generic so signal, which can be written as follows:

$$s(t)=v(t)+n(t) \qquad \text{R4}$$

where s(t) is the acquired signal, v(t) is the true value of the quantity acquired and n(t) is the noise which is nevertheless present.

In the integration process, noises can play a fundamental role. If, for example, the noise is an offset originating from the pre-amplification circuit or the noise has a non-zero average, the integration of this offset would produce drift on the integrated signal which could completely invalidate the calculations performed.

Therefore, it is preferable to almost completely cancel out the noise n(t).

The push-button unit 7C allows the calculation procedure to be activated only in proximity to a flux variation, i.e. when the magnet is activated.

The values obtained are then shown on the display unit 7D in the form of force and the value of the magnetic induction found.

Finally, a digital to analogue converter allows one to display, by means of a viewer, the time course of the result of equation R3, on the 7D display and/or on any external display.

This function ensures expert technicians can better interpret the magnetic peculiarities of the system to be anchored during the transitory processing phase.

As already partially described, there may be two essentially kinds of probes for magnetic flux detection:
Closed-loop probes
Open-loop probes The open-loop probes are those that connect n north-type poles with n south-type poles on the magnetic apparatus 2, 2A by means of a ferromagnetic path created by the specific workpiece P to be anchored.

In these probes (for example the probe in FIG. 3), it is preferable to monitor only the outgoing flux, i.e. all poles with the same magnetic polarity, in the present case of a north-type polarity. The reason for this is to be found in the fact that since the magnetic field is a closed-line field, the flux of the magnetic induction vector entering the south poles is identical to that exiting the north poles. In practice, there is nothing to stop one adding three more coils and measuring both the north pole flux and the south pole flux. In addition to that, note that the coils can be connected in series, resulting the equation R3 becoming:

$$e(t) = -\left(n_1 \frac{\partial \phi_1}{\partial t} + n_2 \frac{\partial \phi_2}{\partial t} + n_3 \frac{\partial \phi_3}{\partial t}\right) \qquad \text{R5}$$

where $$n_1=n_2=n_2=n \qquad \text{R6:}$$

The three fluxes can then be calculated by inverting the equation R5 and considering that:

$$S_1=S_2=S_2=S \qquad \text{R7:}$$

it will be possible to calculate B, P, and therefore F.

In FIGS. 3, 5, and 7 it is possible to observe how closed-loop probes can be used to measure the magnetic performance of two, four, six, etc. (FIG. 7, 5, 3) magnetic poles in a conventional square pole magnetic anchorage system.

Unlike the previous probes, open-loop probes (FIG. 6) are interposed between the magnetic system and any workpiece to be magnetically anchored.

The probe 3C can be positioned on top of one or more poles and the magnetic loop is closed by the workpiece to be anchored.

Essentially, the parallelepiped 4B of ferromagnetic material 1 is positioned on the magnetic system and made integral therewith by a screw placed in the clamping hole.

Probe 3C will be used to acquire the flux variation.

Various embodiments of the innovation have been described, but others may be conceived using the same innovative concept.

The invention claimed is:

1. A portable meter (1) for detecting a force generated by a magnetic apparatus (2), the meter (1) comprising:

a mobile probe (3) configured to be removably coupled to the magnetic apparatus (2), the probe (3) comprising at least one active ferromagnetic element (4) with a configuration corresponding to that of a pole (N, S) of the magnetic apparatus (2) and an alignment system (5,6) configured to align the at least one active ferromagnetic element (4) to at least one magnetic pole (N, S) of the magnetic apparatus (2), wherein the at least one active ferromagnetic element (4) is surrounded by at least one turn (B) in electrically conductive material; and a detection unit (7) interfaced with the at least one turn (B) so as to detect a magnetic flux that flows through the at least one turn (B) at least during a transient of activation/deactivation of the magnetic apparatus (2).

2. The meter (1) according to claim 1, in which the at least one turn (B) is part of a coil associated with the at least one active ferromagnetic element (4).

3. The meter (1) according to claim 2, wherein the probe (3) further comprises a plurality of passive ferromagnetic elements (4A);

wherein the at least one active ferromagnetic element (4) and the plurality of passive ferromagnetic elements (4A) are arranged in a checkerboard pattern;

wherein a magnetic insulator (I) is positioned between each of the at least one active ferromagnetic element (4) and each of the plurality of passive ferromagnetic element (4A); and wherein the at least on active ferromagnetic element (4) and the plurality of passive ferromagnetic elements (4A) have a shape and an arrangement corresponding to that of the poles (N, S) of the magnetic apparatus (2).

4. The meter (1) according to claim 1, wherein the probe (3) comprises at least one active ferromagnetic element (4) and one passive ferromagnetic element (4A) mutually separated by a magnetic insulator (I), or an active ferromagnetic element (4) and a passively ferromagnetic element (4A) in a magnetic short circuit.

5. The meter (1) according to claim 1, wherein said alignment system is of a visual type.

6. The meter (1) according to claim 1, wherein said alignment system (5, 6, 10) is of a mechanical type and comprise at least one pin or screw (10) for centering in a hole (5) of the ferromagnetic element (4, 4A) or a frame (6).

7. The meter (1) according to claim 1, wherein the detection unit (7) is interfaced with the probe (3) through at least one removable electrical connector (12).

8. The meter (1) according to claim 7, wherein the detection unit (7) comprises a screen (7D) on which to display said force value or a graph of said force.

9. The meter (1) according to claim 1, wherein the detection unit (7) comprises a processing unit (7B) configured to read a magnetic flux detected by the turn (B) during a magnetization transient of the magnetic apparatus (2) and convert that flow into a force value.

10. The meter (1) according to claim 9, wherein the probe (3) comprises an identifier readable by the detection unit in order to associate the probe (3) with its own physical parameters to convert the flow into a force value.

11. A portable meter (1) for detecting a force generated by a magnetic apparatus (2), the meter (1) comprising:

a mobile probe (3) configured to be removably coupled to the magnetic apparatus (2), the probe (3) comprising at least one active ferromagnetic element (4) with a configuration corresponding to that of a pole (N, S) of the magnetic apparatus (2), wherein the probe is configured to align the at least one active ferromagnetic element (4) to at least one magnetic pole (N, S) of the magnetic apparatus (2), and wherein the at least one active ferromagnetic element (4) is surrounded by at least one turn (B) in electrically conductive material; and a detection unit (7) interfaced with the at least one turn (B) so as to detect a magnetic flux that flows through the turn at least during a transient of activation/deactivation of the magnetic apparatus (2).

12. A portable meter (1) for detecting a force generated by a magnetic apparatus (2), the meter (1) comprising:

a mobile probe (3) configured to be removably coupled to the magnetic apparatus (2) the probe (3) including a plurality of active ferromagnetic elements (4), a plurality of passive ferromagnetic elements (4A), and an alignment system (5,6) configured to align the plurality of active ferromagnetic element (4) to at least one magnetic pole (N, S) of the magnetic apparatus (2);

wherein the plurality of active ferromagnetic elements (4) have a configuration corresponding to that of a pole (N, S) of the magnetic apparatus (2) and are each surrounded by at least one turn (B) in electrically conductive material;

wherein the plurality active of ferromagnetic element (4) and the plurality of passive ferromagnetic elements (4A) are arranged in a checkerboard pattern;

wherein a magnetic insulator (I) is positioned between each of the plurality of active ferromagnetic element (4) and each of the plurality of passive ferromagnetic element (4A); and a detection unit (7) interfaced with the at least one turns (B) so as to detect a magnetic flux that flows through the at least one turns (B) at least during a transient of activation/deactivation of the magnetic apparatus (2).

* * * * *

UNITED STATES PATENT AND TRADEMARK OFFICE
CERTIFICATE OF CORRECTION

PATENT NO. : 12,248,036 B2
APPLICATION NO. : 17/919867
DATED : March 11, 2025
INVENTOR(S) : Giuseppe Filosa It is certified that error appears in the above-identified patent and that said Letters Patent is hereby corrected as shown below:

In the Claims

Column 11, Line 29, Claim 3, Line 11. Please change from "wherein the at least on active ferromagnetic element (4)" to -- wherein the at least one active ferromagnetic element (4) --.

Signed and Sealed this
Twenty-second Day of April, 2025

Coke Morgan Stewart
*Acting Director of the United States Patent and Trademark Office*